(12) United States Patent
Nakasu

(10) Patent No.: US 8,112,883 B2
(45) Date of Patent: Feb. 14, 2012

(54) METHOD AND APPARATUS FOR MANUFACTURING ELECTRONIC CIRCUIT BOARD

(75) Inventor: Nobuaki Nakasu, Kawasaki (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 53 days.

(21) Appl. No.: 12/136,148

(22) Filed: Jun. 10, 2008

(65) Prior Publication Data

US 2008/0313893 A1 Dec. 25, 2008

(30) Foreign Application Priority Data

Jun. 15, 2007 (JP) ................... 2007-158314

(51) Int. Cl.
*H05K 3/02* (2006.01)

(52) U.S. Cl. ............. 29/847; 29/830; 29/701; 29/566.3; 382/149; 700/121; 700/124

(58) Field of Classification Search ............ 29/830, 29/846, 847, 701, 566.3, 703, 705, 709, 731; 382/149; 700/121, 124
See application file for complete search history.

(56) References Cited

U.S. PATENT DOCUMENTS

| | | | | |
|---|---|---|---|---|
| 5,046,109 A | * | 9/1991 | Fujimori et al. | 382/144 |
| 6,047,083 A | * | 4/2000 | Mizuno | 382/141 |
| 6,219,113 B1 | * | 4/2001 | Takahara | 349/42 |
| 7,547,560 B2 | * | 6/2009 | Patterson et al. | 438/4 |
| 2003/0197791 A1 | * | 10/2003 | Ogino | 348/218.1 |
| 2005/0259190 A1 | * | 11/2005 | Wang et al. | 349/38 |
| 2007/0177787 A1 | * | 8/2007 | Maeda et al. | 382/141 |

FOREIGN PATENT DOCUMENTS

| | | | |
|---|---|---|---|
| JP | 2000-208902 | * | 7/2000 |
| JP | 2003-098547 | | 4/2003 |
| JP | 2005-316489 | | 11/2005 |
| JP | 2006-303227 | | 11/2006 |
| JP | 2007-163892 | | 6/2007 |
| JP | 2007-316244 | | 12/2007 |

\* cited by examiner

*Primary Examiner* — Derris Banks
*Assistant Examiner* — Jeffrey T Carley
(74) *Attorney, Agent, or Firm* — Antonelli, Terry, Stout & Kraus, LLP.

(57) ABSTRACT

A method for manufacturing an electronic circuit board which contains an electronic circuit on a main surface of a glass substrate according to the invention sequentially performs a step of electrically inspecting the main surface of the glass substrate on which the electronic circuit is formed, a step of specifying positions and defect types of defects on the main surface of the glass substrate, a step of calculating reference point coordinates on the main surface of the glass substrate and correcting the coordinates, a step of extracting respective defects from an image around the defects and specifying a defect to be corrected in the extracted defects by referring to a defect existing range registered in advance for each defect type, and a step of cutting the specified defect. By this method, a foreign material adhering to the glass substrate is not erroneously judged as short-circuit defect causing short-circuit on the electronic circuit, and only defect actually requiring correction can be removed.

5 Claims, 21 Drawing Sheets

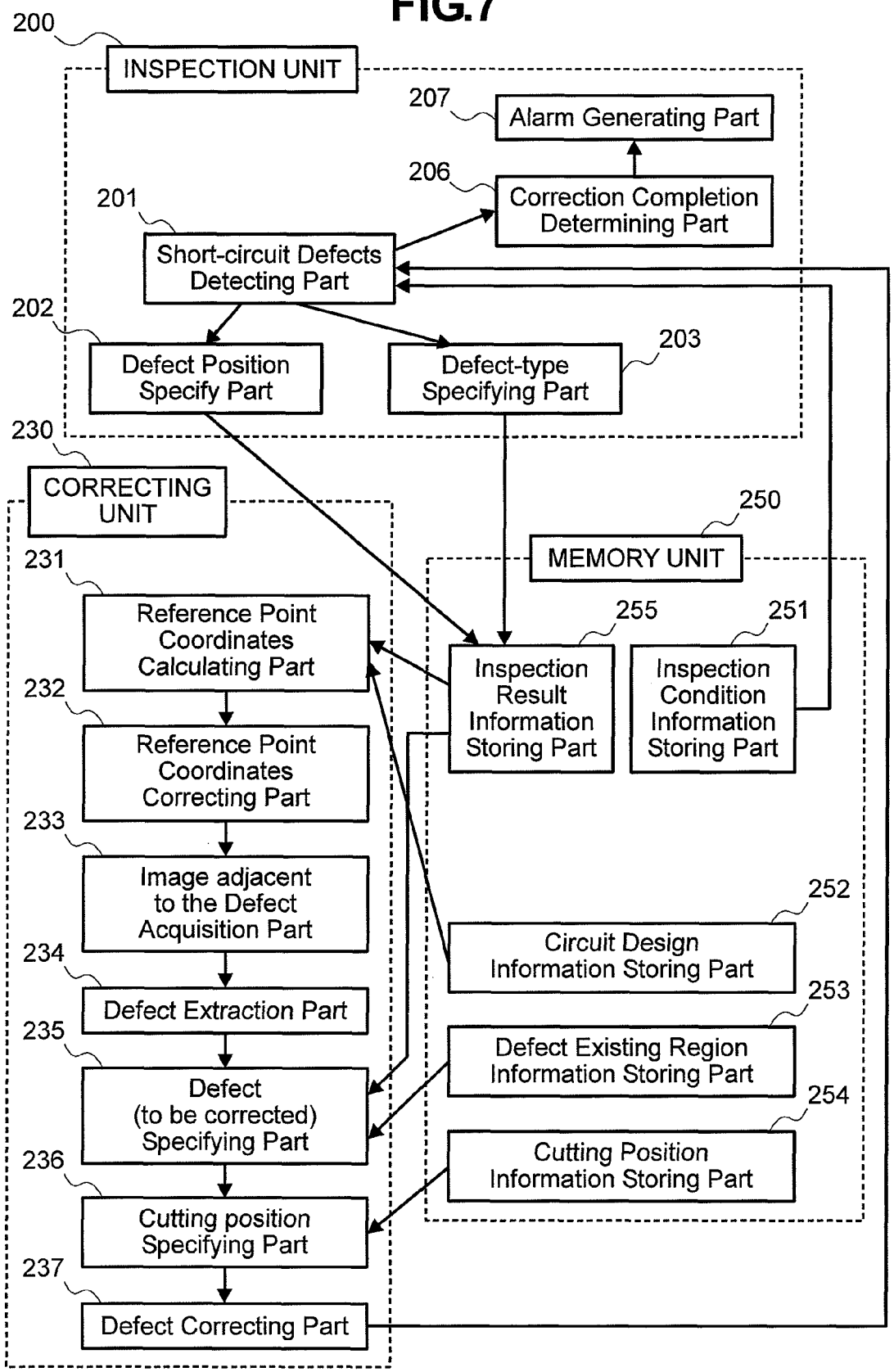

FIG.17

| No. | Priority | Defect Region | Cutting Portion 1 | Cutting Portion 2 |
|---|---|---|---|---|
| 1 | 1 | 60a | 52a | - |
| 2 | 2 | 60b | 52b | 52c |
| 3 | 3 | 60c | 52b | 52c |

| No. | Priority | Defect Region 1 | Defect Region 2 | Cutting Portion 1 | Cutting Portion 2 |
|---|---|---|---|---|---|
| 1 | 1 | 60a | 60b | 52a | - |
| 2 | 2 | 60b | 60c | 52b | 52c |
| 3 | 3 | 60d | - | 52b | 52c |

METHOD AND APPARATUS FOR MANUFACTURING ELECTRONIC CIRCUIT BOARD

The present application claims priority from Japanese application JP2007-158314 filed on Jun. 15, 2007, the content of which is hereby incorporated by reference into this application.

BACKGROUND OF THE INVENTION

1. Field of the Invention

The present invention relates to a method and an apparatus for manufacturing an electronic circuit board, and particularly to a technology for correcting short-circuit defect of an electronic circuit board on which repeated wirings and electrode patterns are formed.

2. Description of the Related Art

Currently, there is a heavy demand for cost reduction of a liquid crystal display panel with expansion of its market. On the other hand, the size of a glass substrate required for the manufacture of the liquid crystal display panel becomes larger and larger every year. In this situation, it is difficult to produce such a liquid crystal display panel causing no short-circuit defect only by process improvement, which is one of the major reasons for cost increase. Thus, a step for correcting this defect is currently needed.

The liquid crystal display panel includes a thin film transistor substrate (TFT substrate) on which pixel circuits, driving circuits and the like are provided, a color filter substrate (opposed substrate) on which red, blue, and green resin films and the like are disposed in matrix, and liquid crystals sandwiched between the TFT substrate and the opposed substrate. Pattern defect produced on the color filter or the circuit causes display abnormality, and the liquid crystal display panel containing display abnormality becomes an inferior product. Examples of display abnormality includes coloring defect caused by entrance of resin applied to the color filter into adjacent pixels, application unevenness caused by non-uniform thickness of resin film, short-circuit and disconnection of circuits containing wirings, electrodes and the like, and others. Particularly, the short-circuit defect of the circuit can be easily corrected by cutting only the wire or electrode corresponding to the short-circuit, and a preferable product can be easily produced.

For example, a cutting method by applying laser beam to the short-circuit portion based on defect coordinates detected by an inspection device, and a removing method by using a micro-manipulator are known as technology for correcting the short-circuit defect of the circuit. There is also an automatic correction technology for automatically identifying the detect portion based on defect coordinates and defect image detected by an optical inspection device, and removing the defect portion by using cutting patterns set in advance. JP-A-2000-208902 discloses an example of this automatic correction technology.

SUMMARY OF THE INVENTION

However, it is difficult to judge whether electric short-circuit has been actually caused or not through optical inspection. In this case, there is a possibility that a foreign material only adhering to the TFT substrate on which the circuit is formed is erroneously judged as short-circuit defect, for example. When laser beam is applied to the erroneously judged defect portion for removal of this portion based on erroneous judgment, defect is actually caused by cutting the normal circuit. Also, correction time is prolonged due to addition of time for applying laser beam to the defect area which need not be removed. Furthermore, an electric inspection device only detects short-circuit and open-circuit between wirings and electrodes, and cannot specify the position (coordinates) of the defect causing short-circuit or open-circuit on the substrate.

It is an object of the invention to provide a method and an apparatus for manufacturing an electronic circuit board which includes a step for correcting only a part actually requiring removal by appropriately selecting a correction target to improve correction efficiency, and for preventing defect caused by cutting normal circuit based on erroneous judgment.

In order to achieve this object, a method and an apparatus for manufacturing an electronic circuit board specify a target to be corrected by comparison with defect existing areas registered in advance for each defect type based on defect position and defect type obtained by electric inspection so as to prevent erroneous judgment. Also, the method and apparatus for manufacturing the electronic circuit board select appropriate cutting position from the cutting positions stored in association with the defect existing areas and defect types to perform appropriate correction.

The typical structure according to the invention includes the steps of: detecting a defect caused by short-circuit between electrodes of a circuit on the electronic circuit board; specifying correction target defect based on defect existing area information stored in advance in association with defect type after specifying the position and the defect type of the detected defect; and cutting and correcting a short-circuit defect portion based on the cutting position information stored in advance in association with the defect type and the defect existing area information.

According to the technology of the invention, defect is automatically corrected, and the effect of labor-saving is provided. Moreover, only defect which actually needs to be removed is corrected. As a result, the correction device is used with considerably higher efficiency, and defect caused by erroneous application of laser beam is prevented. Thus, reduction of manufacturing cost can be achieved.

BRIEF DESCRIPTION OF THE DRAWINGS

FIG. 7 illustrates a system structure according to a second embodiment of the invention;

FIG. 17 shows a table associating cutting positions with defect existing areas;

DETAILED DESCRIPTION

Figure 1:
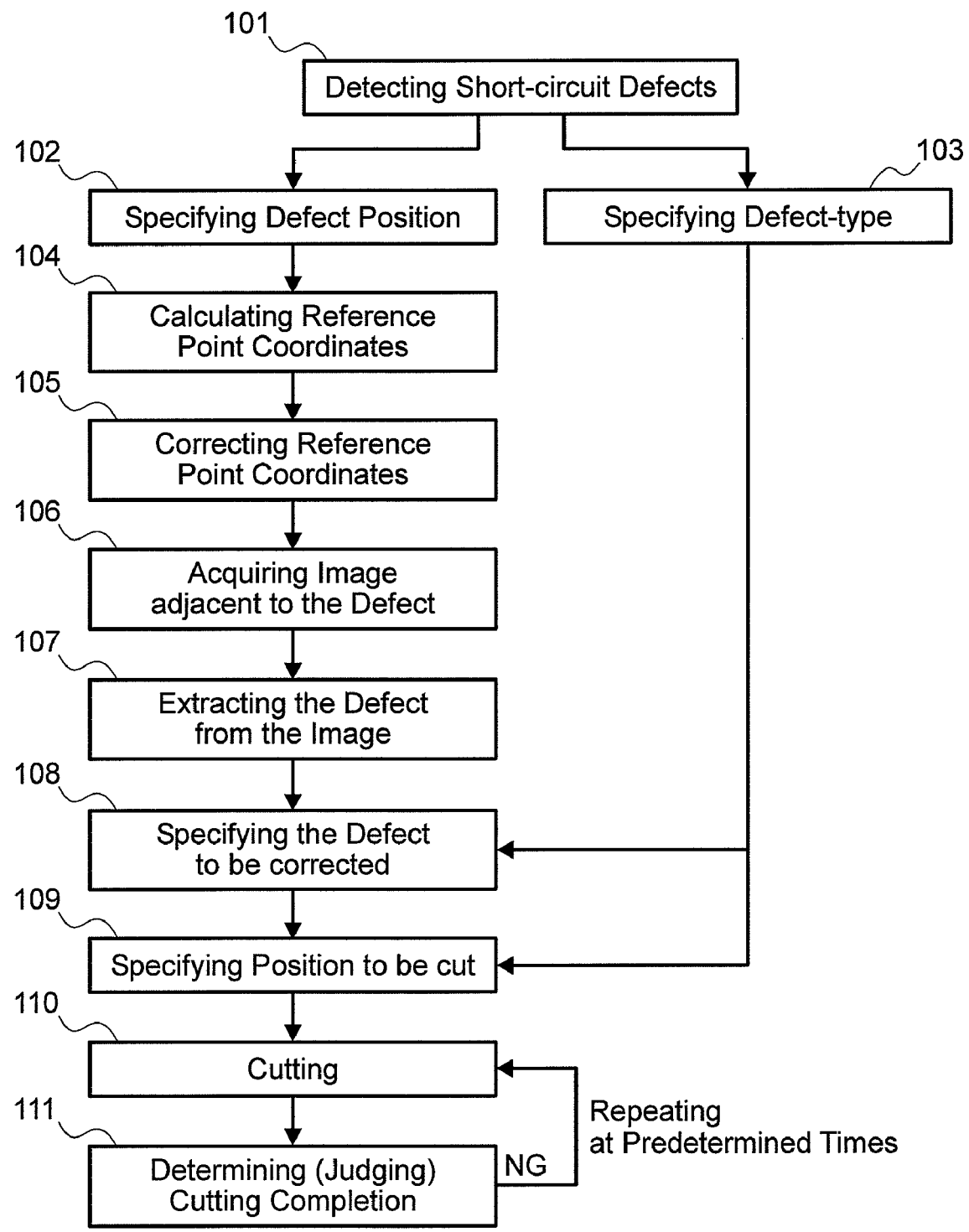
FIG. 1 illustrates a method for manufacturing an electronic circuit board according to a first embodiment of the invention.

The best modes for carrying out the invention are hereinafter described in detail with reference to the appended drawings. In the following embodiments, correction of wirings and electrodes formed on a liquid crystal display panel is discussed as an example. However, the technology of the invention is not limited to correction of a liquid crystal display panel, but is generally applicable to correction of an electronic circuit board containing repeated wirings on a flat surface.

First Embodiment

A first embodiment according to the invention is now described with reference to FIGS. 1 through 6B. FIG. 2 is a cross-sectional view of a typical liquid crystal display panel. This liquid crystal display panel has a liquid crystal 40 sandwiched between substrates 9a and 9b which are preferably formed by two sheets of glass. The liquid crystal display panel controls the direction (orientation) of liquid crystal molecules constituting the liquid crystal 40 by electric field generated by a pixel electrode 34 and an opposed electrode 41 within a capacitor to control light transmittance of a backlight 45. A circuit for controlling voltage applied to the pixel electrode 34 is provided on the substrate 9a, and a color filter is disposed on the substrate 9b so as to display a color image.

Since circuits constituted by thin film transistors such as pixel circuits and driving circuits are provided on the substrate 9a, the substrate 9a is called a thin film transistor substrate (TFT substrate). On the other hand, the substrate 9b is called an opposed substrate or a color filter substrate. The liquid crystal display panel shown in FIG. 2 is a so-called TN type panel on which not-shown counter electrodes (common electrodes) are provided on the inner surface of the opposed substrate 9b. Obviously, the invention is not limited to the TN type but may also be an IPS type which contains counter electrodes on the TFT substrate 9a side.

Figure 3A:
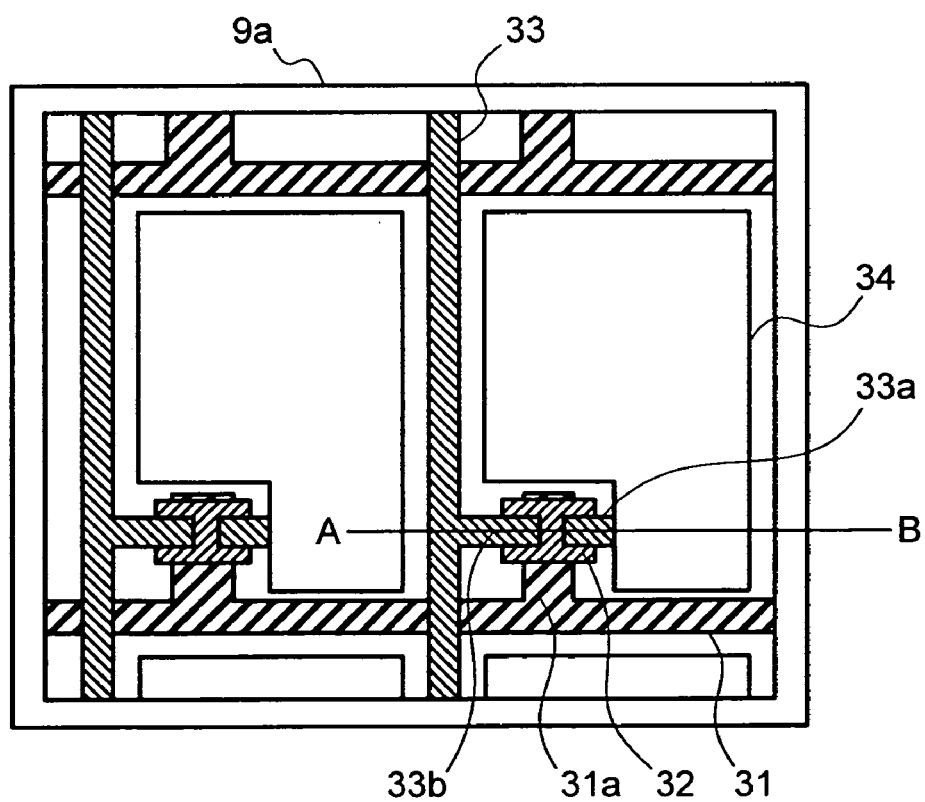
FIG. 3A is a plan view of the liquid crystal display panel.
Figure 3B:
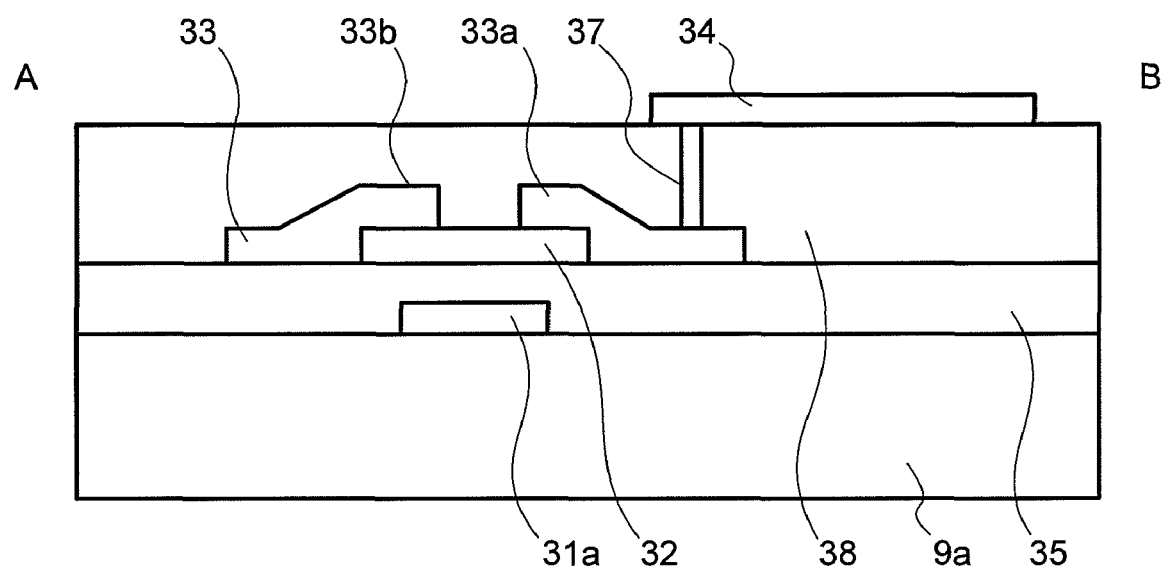
FIG. 3B is a cross-sectional view of the liquid crystal display panel taken along a line A-B in FIG. 3A.

FIG. 3A is a plan view illustrating a main part of a typical pixel circuit mounted on the TFT substrate. FIG. 3B is a cross-sectional view taken along a line A-B in FIG. 3A. The circuit provided on the TFT substrate 9a has a plurality of laminated patterns. The thin-film multilayer circuit formed on the TFT substrate 9a includes gate electrodes 31, a silicon semiconductor film (a-Si in this example) 32, data wirings 33, source electrodes 33a, drain electrodes 33b, pixel electrodes 34, a gate insulation film 35, a protection film 38, and others. The pixel electrodes 34 are connected with the source electrodes 33a via through holes 37.

A thin-film transistor part constituted by the silicon semiconductor film 32 corresponds to a semiconductor switch. When predetermined voltage is applied to the gate electrode 31a, the semiconductor switch is turned on. Then, voltage applied to the drain electrode 33b via the data wiring 33 is given to the pixel electrode 34 via the source electrode 33a to drive the liquid crystal. When the semiconductor switch is turned off by decreasing the voltage applied to the gate electrode 31, the voltage of the capacitor formed by the pixel electrode 34 and the counter electrode 41 is maintained. The insulation film 35 is provided between the gate electrode 31a and the silicon semiconductor film 32 and between the gate wiring 31 or gate electrode 31a and data wiring 33, the drain electrode 33b or the source electrode 33a so as to prevent short-circuit between these wirings or electrodes.

Figure 4:
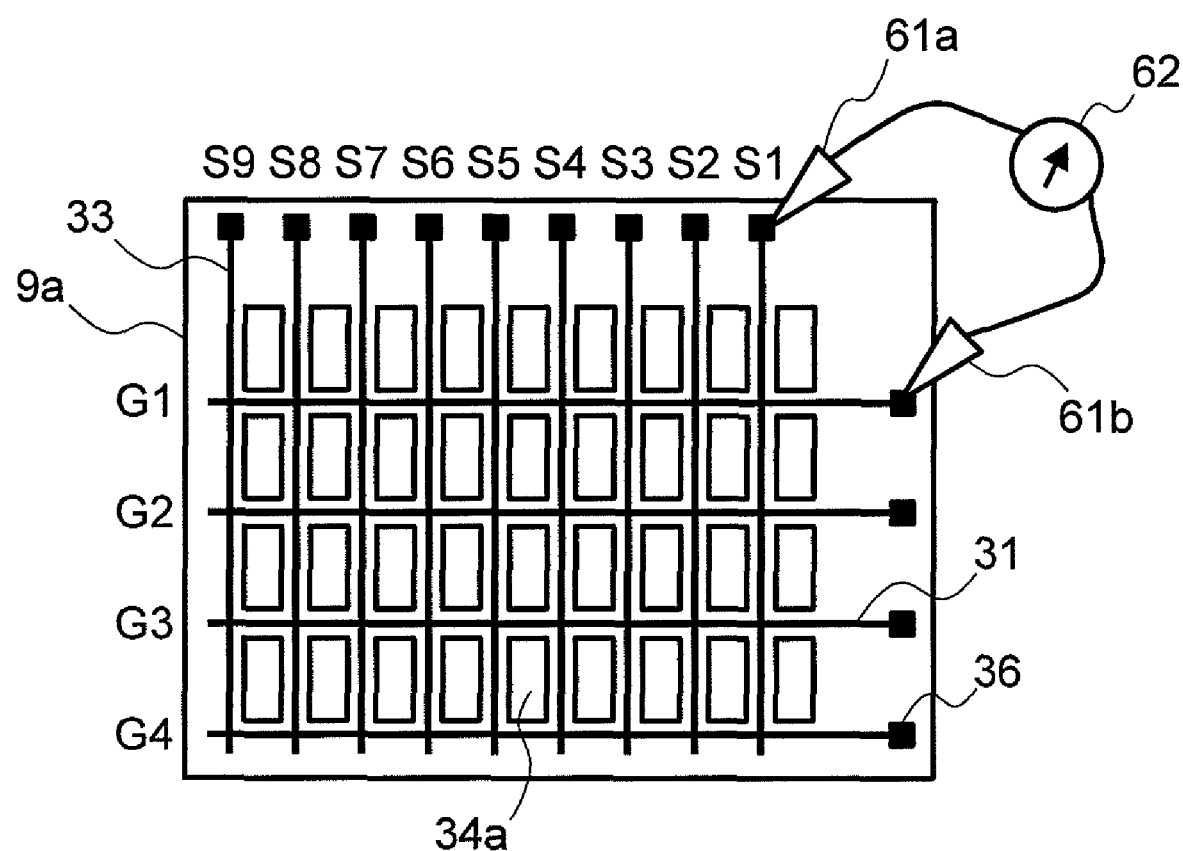
FIG. 4 is a plan view of another liquid crystal display panel.

FIG. 4 illustrates layout of a typical pixel circuit on the liquid crystal display panel. FIG. 4 does not show the silicon semiconductor film 32 and the insulation film 35 for simplifying the explanation. The gate wirings 31 and the data wirings 33 cross each other at right angles on the TFT substrate 9a, and the plural wirings of both types are disposed at equal intervals to form a matrix. In FIG. 4, reference numbers G1 through G4 are given to the respective gate wirings 31, and reference numbers S1 through S9 are given to the respective data wirings 33 to identify these wirings. As discussed above, gate electrodes are connected with the gate wirings 31, and drain electrodes are connected with the data wirings 33.

The liquid crystal display panel controls voltage applied to one pixel electrode 34 via one gate wiring 31 and one data wiring 33. For example, the liquid crystal display panel controls the pixel electrode 34a by G4 of the gate wirings 31 and S5 of the data wirings 33. Pads 36 in contact with probes 61a and 61b of a resistance measuring device 62 are provided at the respective ends of the gate electrodes 31 and the data wirings 33. According to an example of short-circuit inspection method, the probes 61a and 61b of the resistance measuring device 62 are attached to the pad 36 of G1 of the gate wirings 31 and the pad 36 of S1 of the data wirings 33, respectively, to measure electric resistance, for example. When the resistance obtained by the measurement is smaller than a value measured beforehand, it is judged that short-circuit has been caused. Similarly, short-circuit between G1 and G2 of the gate wirings 31 and short-circuit between S1 and S2 of the data wirings 33 can be detected, for example.

Figure 5:
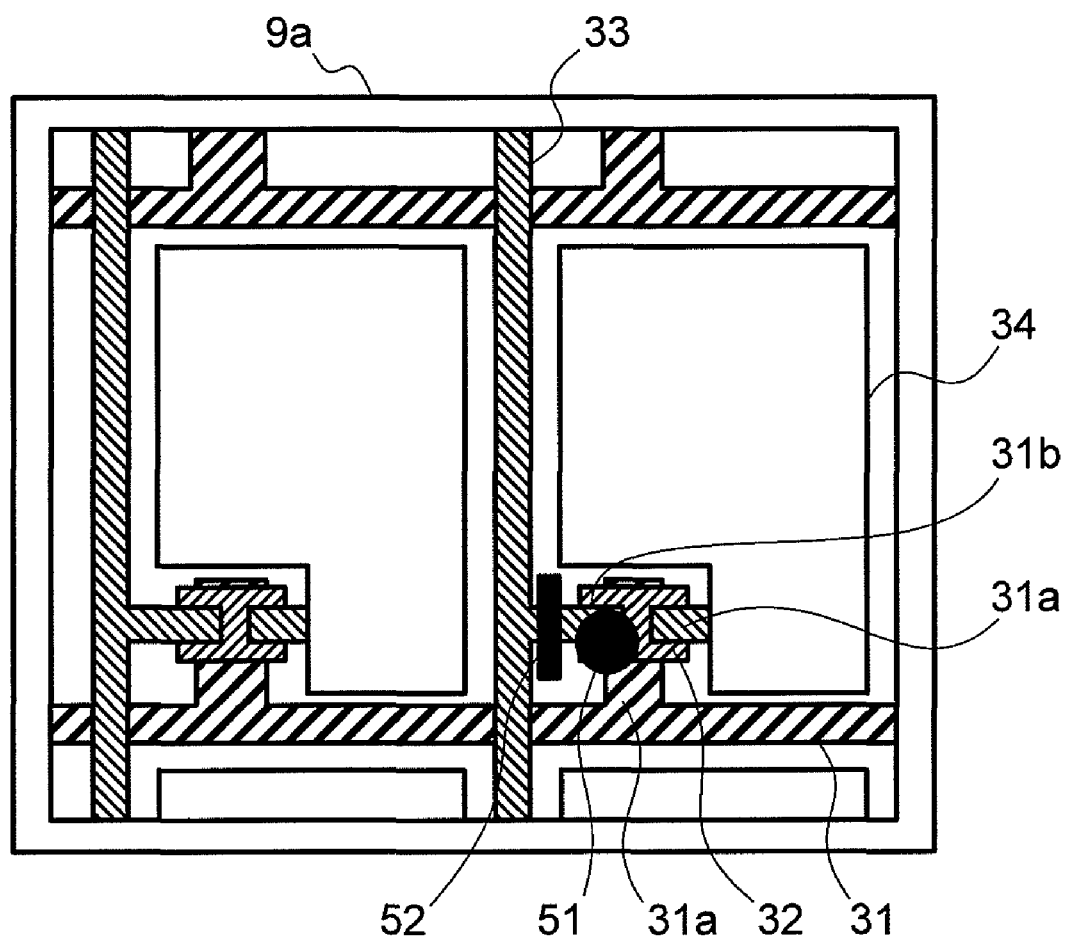
FIG. 5 illustrates a cutting position at the time of short-circuit defect.

FIG. 5 is a plan view illustrating a main part where short-circuit defect is produced by a foreign material having entered the insulation film provided between the gate electrode and the drain electrode. While only an example of short-circuit defect caused by a foreign material is shown in this embodiment, the technology of the invention is applicable to correction of short-circuit caused for other reasons such as loss of the insulation film 35 and short-circuit within the same layer. Since difference voltages are applied to the gate electrode 31a and the drain electrode 33b, the circuit does not operate in the normal condition at the time of short-circuit. Thus, laser beam is applied to a cutting position 52 to cut the drain electrode 33b from the data wirings 33 and correct the short-circuit defect.

However, a general electric inspection method specifies not the portion containing the defect of short-circuit, but only the gate electrode 31a and drain electrode 33b causing the short-circuit. Moreover, the cutting position 52 varies according to the defect types and circuit patterns. Thus, the operator is required to specify the defect portion and determine the cutting position 52 for each defect for removal of the defect portion.

Figure 2:
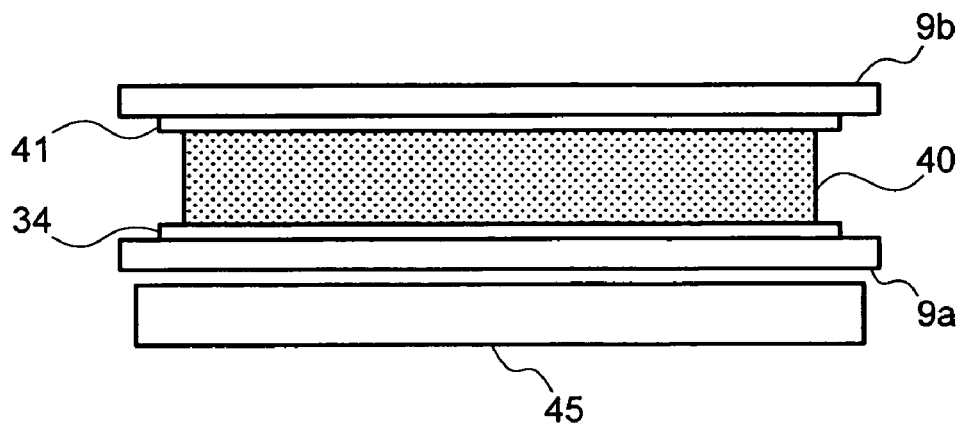
FIG. 2 is a cross-sectional view of a liquid crystal display panel.

FIG. 1 shows steps of an electronic circuit board manufacturing method according to the first embodiment of the invention. As shown in FIG. 1, this method uses information about the positions of the gate electrode 31a and the drain electrode 33b, or the positions of the plural gate electrodes 31a or the plural drain electrodes 33a causing short-circuit, and the defect types based on the detection of electric inspection. By this method, the position and type of the defect causing short-circuit can be specified, and the cutting position 52 can be automatically selected to correct the defect.

As shown in FIG. 1, an electric short-circuit defect detecting step 101 is initially performed. Then, a defect position specifying step 102, and a defect type specifying step 103 are executed. The defect position herein refers to specification of the pixel electrode 34 causing short-circuit defect by using the numbers given to two electrodes causing short-circuit, or the number given to the pixel electrode 34 causing operation defect.

The pixel circuit of the liquid crystal display panel contains the gate electrodes 31 and the source electrodes 33 crossing one another at right angles, and uses a pair of the gate electrode 31a and the drain electrode 33b to control one pixel. Thus, the gate electrode 31 and the source electrode 33 associated with the defective pixel can be specified based on the pixel causing defect. Also, the types of defect such as short-circuit defect caused by the gate electrode 31a and the drain electrode 33b or by one and another gate electrodes 31a can be specified from the numbers of the electrodes in contact with the probe 61 during inspection, for example.

Then, a reference point coordinates calculating step 104 is performed based on design information of the circuit stored in advance and the positions of the gate electrode 31a and the drain electrode 33b obtained from the inspection device. When the reference point is the cross point of the gate electrode 31a and the drain electrode 33b, the reference point can be easily calculated from the coordinates of the first electrode and the electrode intervals stored in advance due to the equal intervals of the gate electrodes 31a and the drain electrodes 33b. Alternatively, a position shifted from the cross point of the gate electrode 31a and the drain electrode 33b by a predetermined amount may be determined as the reference point. Also, reference point coordinates stored in association with the numbers of the gate electrode 31a and the drain electrode 33b may be used as the reference point.

Then, a reference point coordinates correcting step 105 is performed. In this step, an image is obtained by using the calculated reference point coordinates, and the reference point is detected by pattern matching or other method. The image obtained based on the reference point coordinates is adjusted such that the reference point is located at a predetermined position of the image. Thus, the detected shift amount from the predetermined position of the reference point coordinates corresponds to the correction value. Then, an image acquiring step 106 is executed for the pixel causing short-circuit based on the corrected reference point coordinates, and a defect extracting step 107 is carried out. The defect extracting step 107 is performed by comparison with an image obtained by a normal circuit, comparison with design data, or by other methods.

Figure 6A:
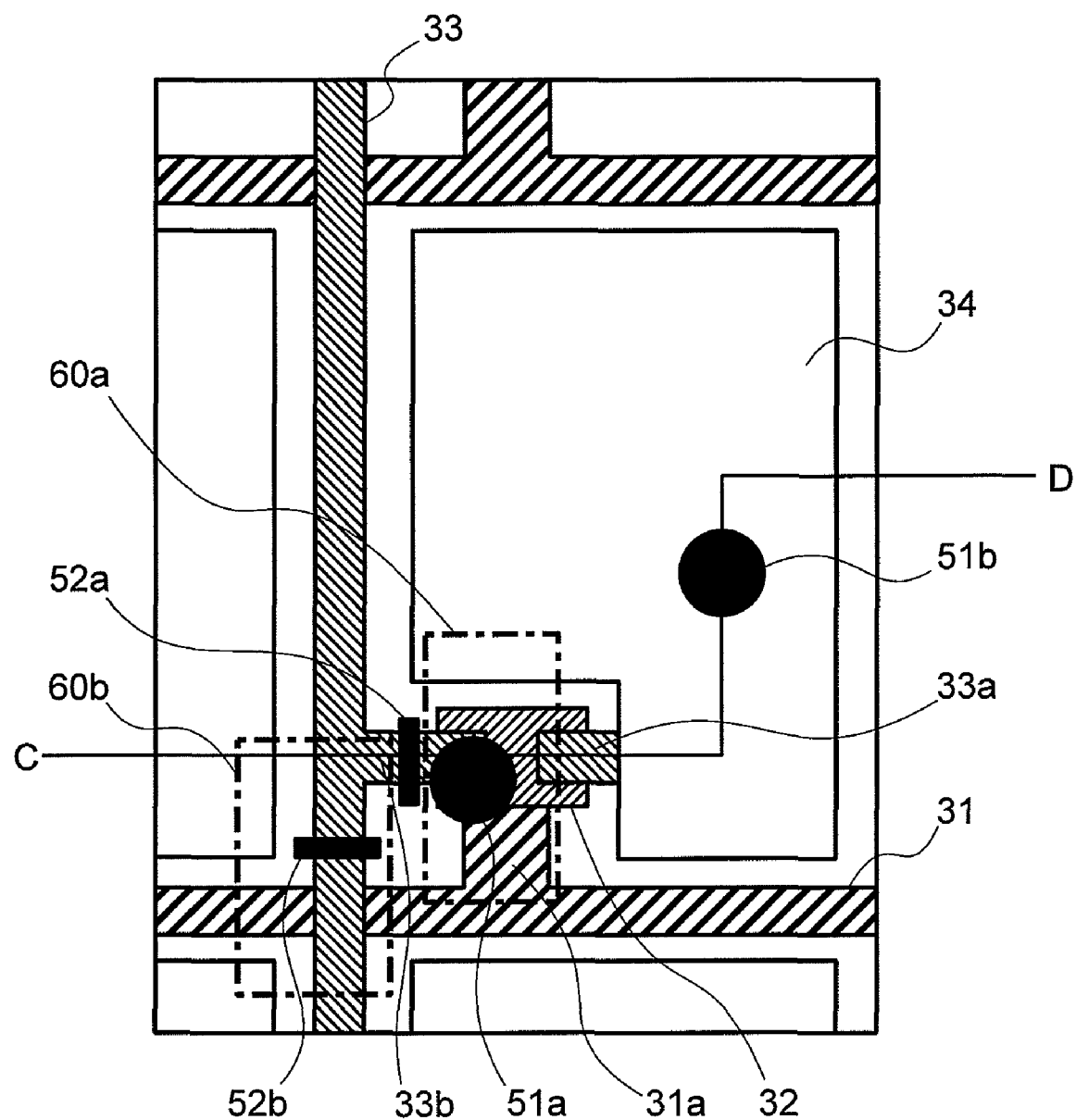
FIG. 6A illustrates another cutting position at the time of short-circuit defect.
Figure 6B:
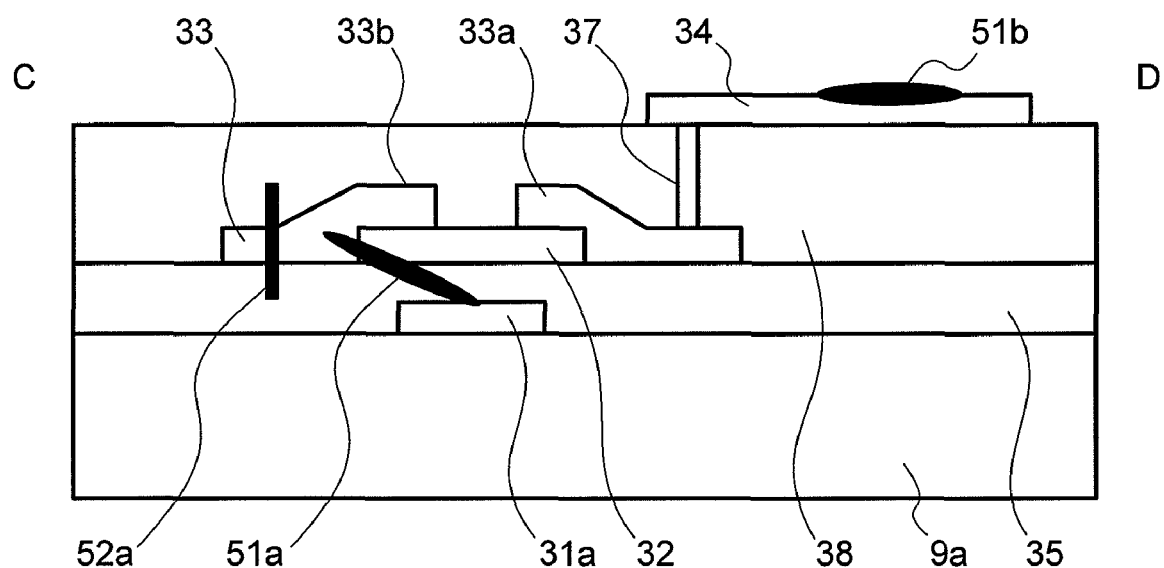
FIG. 6B is a cross-sectional view showing a further cutting position at the time of short-circuit defect taken along a line C-D in FIG. 6A.

Then, a defect (to be corrected) specifying step 108 is executed. FIG. 6A is a plan view illustrating a main part of another cutting position at the time of short-circuit defect as a figure corresponding to FIG. 5. FIG. 6B is a cross-sectional view taken along a line C-D in FIG. 6A. The defect detected and extracted in the defect extracting step 107 includes a foreign material 51b which only adheres to the substrate (pixel electrode 34 in this example) but does not cause short-circuit as well as the foreign matter 51a causing short-circuit shown in FIGS. 6A and 6B. Removal of the foreign material 51b is not only a process different from the process contributing to correction of short-circuit, but also a process causing damage to the pixel electrode 34. Thus, removal of the foreign material 51b is a process to be eliminated.

The areas having possibility of containing short-circuit defect are determined for each defect type according to the layout of wirings and electrodes. The areas which possibly include defect causing short-circuit are herein defined as defect existing areas. For example, short-circuit of the gate electrode 31 and the drain electrode 33b shown in FIG. 6A is only caused in defect existing areas 60a and 60b indicated by dashed lines. Thus, the foreign material 51a causing the short-circuit can be specified by comparing the detected positions of the foreign materials 51a and 51b with the defect existing areas 60a and 60b stored in a memory unit to be described later for each defect type beforehand. The coordinates of the foreign material 51a correspond to the defect coordinates.

In the defect specifying step S108, color information can be used as well as the information about the position of the foreign material 51. For example, when short-circuit defect is caused by insufficient insulation characteristics due to thickness decrease of the insulation film 35, interference fringes of illumination light are produced on the thin portion of the insulation film 35. In case of white illumination light to be applied, the positions of the produced interference fringes vary according to respective wavelengths. In this case, rainbow-color interference fringes are generated. Thus, the defect specifying step 108 can be achieved by detecting this interference color.

Then, a cutting position selecting step 109 is performed. Cutting positions 52a and 52b are stored in the memory unit to be described later in advance for each defect type and each of the defect existing areas 60a and 60b. For example, in case of short-circuit defect of the gate electrode 31 and the source electrode 33 shown in FIGS. 6A and 6B, the correction target defect exists in the defect existing area 60a. Thus, the cutting position 52a is selected, and a cutting step 110 is now executed. While the case of one cutting position is shown in this example, plural positions may be cut. The cutting position may be cut by using laser beam, micro-manipulator, micro-plasma, or other cutting method.

Then, a cutting finish judging step 111 is performed. An image at the cutting position 52a is obtained to judge whether cutting has been completed or not. When it is judged that cutting is not completed, the cutting step 110 is again executed. The cutting finish judging step 111 may be carried out by inspection such as optical inspection and electric inspection. When cutting is not completed even after repetition of the cutting finish judging step 111 predetermined times, the operation is suspended. Warning may be generated at the time of suspension.

According to this embodiment, laser beam is not applied to the foreign material not requiring laser beam application but is applied only to the correction target defect of the detected foreign materials. In this case, defect is not produced by erroneous application of laser beam, and therefore manufacturing cost can be reduced. Also, the function for automatically judging whether laser beam application is necessary or not eliminates the need for judgment operation by the operator, which offers the advantage of labor-saving.

Second Embodiment

A second embodiment according to the invention is now described with reference to FIGS. 7 through 15. FIG. 7 illustrates a structure of a correction device included in a manufacturing apparatus for an electronic circuit board according to an example of the invention. This example is now discussed as the second embodiment of the invention. The correction device included in the manufacturing apparatus according to this embodiment has an inspection unit 200, a correction unit 230, and a memory unit 250. The inspection unit 200 is a unit for detecting short-circuit defect, and constituted by a short-circuit defect detecting part 201, a defect position specifying part 202, and a defect type specifying part 203.

The short-circuit defect inspection part 201 is a unit for attaching the probe 61 (61a and 61b in FIG. 4) to the pads of all the gate wirings 31 and data wirings 33, and measuring electric resistance between the gate wirings 31 and the data wirings 33, for example. The defect position specifying part 202 recognizes the condition of short-circuit defect when the measured electric resistance is smaller than a predetermined set value, and specifying the position numbers of the gate wiring 31 and data wiring 33 causing short-circuit from the origin of the board, for example.

The defect type specifying part 203 is a unit for specifying the type of defect based on the selection of the two electrodes targeted at the measurement of electric resistance. For example, when electric resistance between the gate wiring 31 and the data wiring 33 is measured, it is judged that short-circuit between the gate electrode 31 and the source electrode 33 has been caused. When electric resistance between one and another data wirings 33 is measured, it is judged that short-circuit between the two data wirings 33 has been caused. Values necessary for the inspection such as the electrodes selected for measuring electric resistance and the resistance judged as short-circuit are stored in an inspection condition storing part 251 in the memory unit 250 in advance. The inspection results obtained by the defect position specifying part 202 and the defect type specifying part 203 are stored in an inspection result storing part 255.

The correction unit 230 is a unit for correcting a defect portion based on the inspection result obtained by the inspection unit 200. A reference point coordinates calculating part 231 reads the defect position from the inspection result storing part 255 and circuit design information from a circuit design information storing part 252, and calculates reference point coordinates from the defect position. In case of the reference point corresponding to the cross point of the gate wiring 31 and the data wiring 33, the board coordinates of the first electrode of the gate wirings 31 and the distance between the respective gate wirings 31 are stored in the circuit design storing part 252 in advance, for example. In this case, positions of the gate wirings 31 of arbitrary numbers can be converted into board coordinates. Similarly, the positions of the data wirings 33 are converted into board coordinates to calculate the coordinates of the cross point.

Figure 14:
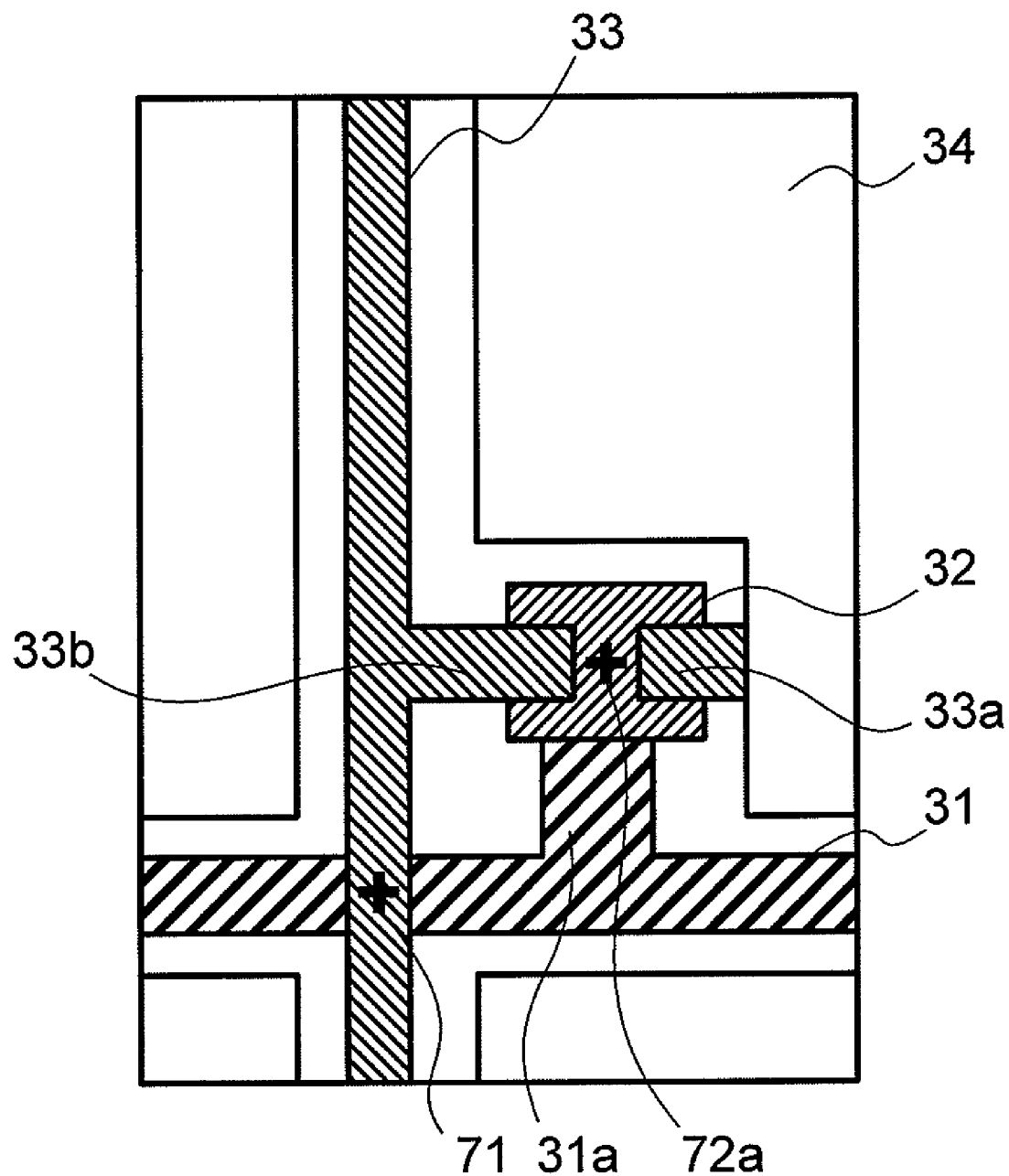
FIG. 14 illustrates a reference point setting method.

It is possible to determine the reference point as a position shifted by the amount of offset from the cross point of the gate wiring 31 and the data wiring 33. For example, a reference point 72a shifted by the amount of offset stored beforehand from a cross point 71 of the gate wiring 31 and the data wiring 33 as illustrated in FIG. 14.

Figure 15:
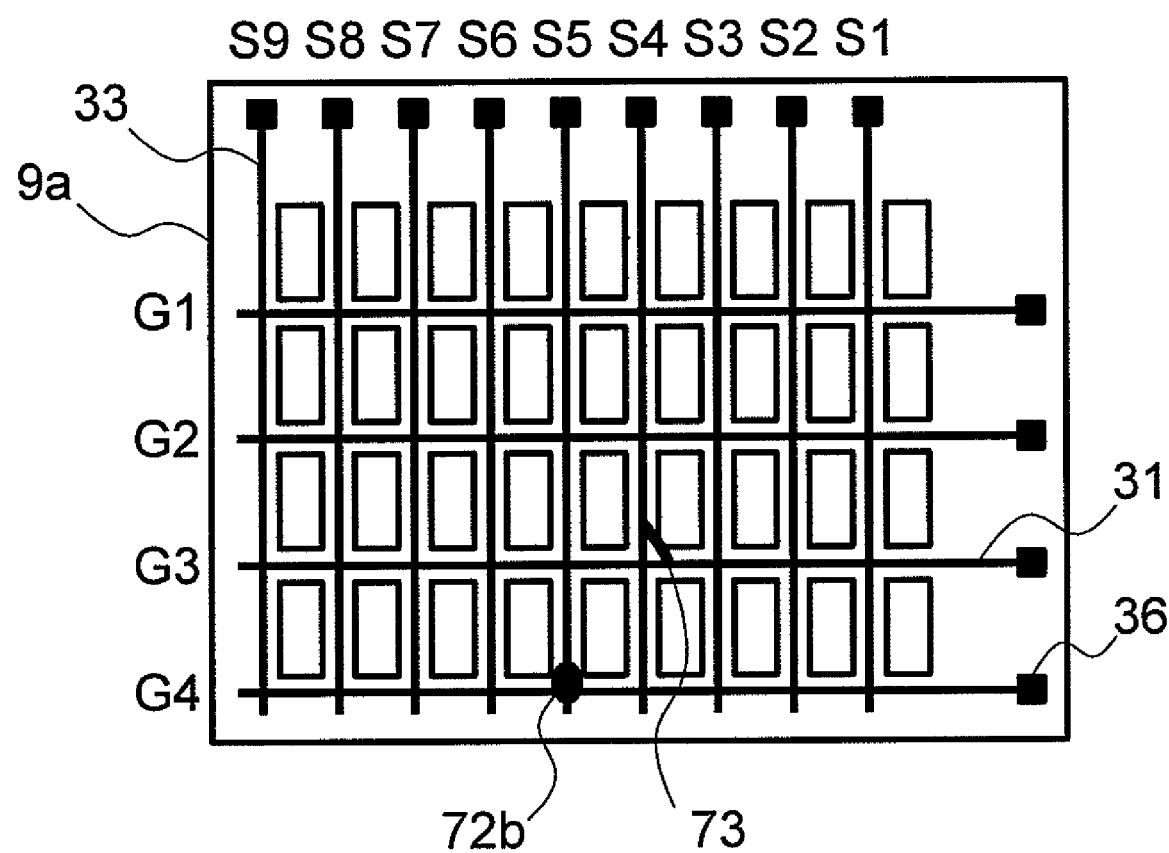
FIG. 15 illustrates another reference point setting method.

A defect exists in the vicinity of the position at which short-circuit is produced, and erroneous recognition may be caused in the following reference point coordinates correcting step. Thus, it is preferable that the reference point is established at a position sufficiently away from the defect coordinates. For example, when short-circuit 73 is caused between G3 of the gate wiring 31 and S4 of the data wiring 33 as illustrated in FIG. 15, it is preferable that the reference point is set not in the vicinity of the cross point of G3 of the gate wiring 31 and S4 of the data wiring 33 but in the vicinity of the cross point of G4 of the gate wiring 31 and S5 of the data wiring 33. Since the intervals between the gate wirings 31 and the data wirings 33 have been stored in advance, the cross coordinates of the gate wiring 31 and the data wiring 33 positioned away by several lines can be easily calculated.

A reference point coordinates correcting part 232 is a unit for calculating correction value for the reference point. Generally, a carrying unit which shifts the board contains positioning errors. Thus, the reference point shifted to the position corresponding to the coordinates calculated by the reference point coordinates calculating part 231 is not necessarily located at a predetermined position in a visual field of a camera. Thus, an image of the reference point is obtained after the shift of the reference point, and the reference point is detected from the image by using a general method such as pattern matching. Then, the correction value of the reference point coordinates is calculated.

A image adjacent to the defect acquisition part 233 is a unit for obtaining an image of an area affected by the gate wiring 31 and the data wiring 33 specified as those causing short-circuit. For example, the area shown in FIG. 6A is sufficient as the area of the image to be acquired. A defect extracting part 234 is a unit for extracting the defect portion from the image obtained by the image acquisition part 233. The method for extracting the defect may be a method of comparison with an image of a normal circuit, comparison with design data, or other methods. Since the reference point coordinates have been already calculated, the coordinates of the defect can be easily calculated from the acquired image.

A correction target defect specifying part 235 is a unit for extracting defect to be corrected. The correction target defect specifying part 235 reads defect existing area information associated with the defect type stored in the inspection result storing part 255 from the defect existing area storing part 253. The defect existing area is stored by using relative coordinates from the reference point, and can be converted into board coordinates based on the reference point coordinates. The correction target defect specifying part 235 compares the coordinates of the defect extracted from the defect extracting part 234 with the calculated defect existing area to specify the defect to be corrected.

Figure 9:
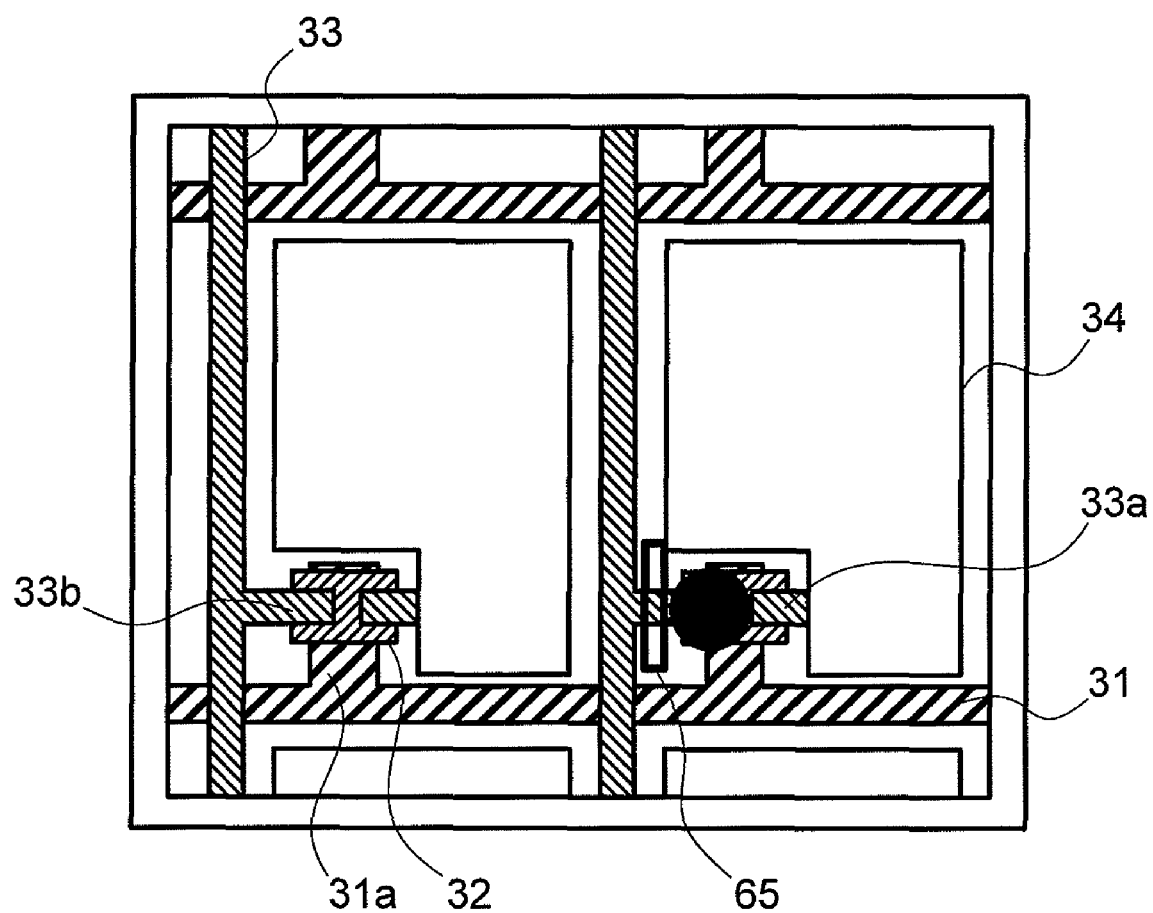
FIG. 9 illustrates a cutting position displayed on a monitor.

A cutting position specifying part 236 is a unit for calculating the cutting position. The cutting position specifying part 236 selects the cutting position stored in a cutting position information storing part 254 in advance based on the defect existing area 60 where the defect to be corrected exists and the defect type. The cutting position stored in association with the defect existing area 60 and the defect type can be easily selected. Also, the cutting position stored by using relative coordinates from the reference position 71 discussed above can be converted into board coordinates based on the corrected reference point coordinates. Since the reference point 71 is located in the vicinity of the defect, the accuracy of the cutting position can be increased. A defect correcting part 237 is a unit for removing the defect portion by using laser beam, micro-manipulator, or other methods. At the time of cutting, the operator can check the cutting position through the display of a cutting portion 65 overlapped on a monitor showing the correction portion as illustrated in FIG. 9. By this method, the possibility of erroneous cutting of the normal part can be eliminated.

A correction finish judging part 206 is included in the inspection unit 200 as a unit for judging completion of the cutting from the result of the electric inspection. When it is judged that the correction has not been completed, the correction finish judging part 206 transmits a signal to a correction device 240 via a communication part 205a to perform correction again. A warning generating part 207 is a unit for generating warning when the cutting completion judgment is not made even after the steps of cutting and cutting completion judgment are repeated predetermined times.

Figure 8:
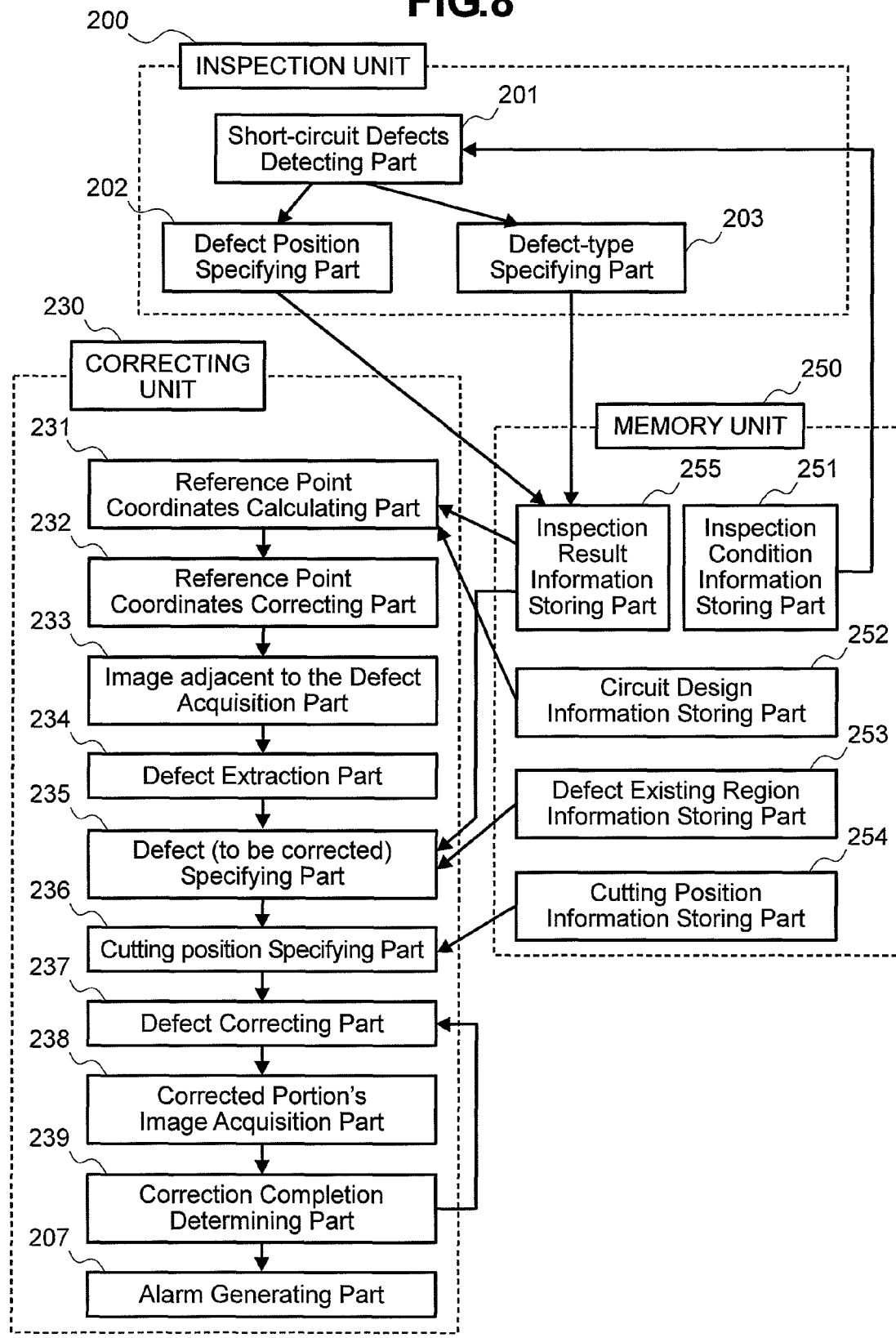
FIG. 8 illustrates another system structure according to the second embodiment of the invention.

FIG. 8 illustrates a structure for making correction finish judgment through optical inspection in the second embodiment. A correction portion image acquiring part 238 is a unit for acquiring an image of the portion cut by the defect correcting part 237. The function of the correction portion image acquiring part 238 may be performed by the image acquisition part 233. A correction finish judging part 239 is a unit for judging whether the cutting has been completed or not based on the obtained image.

Figure 10:
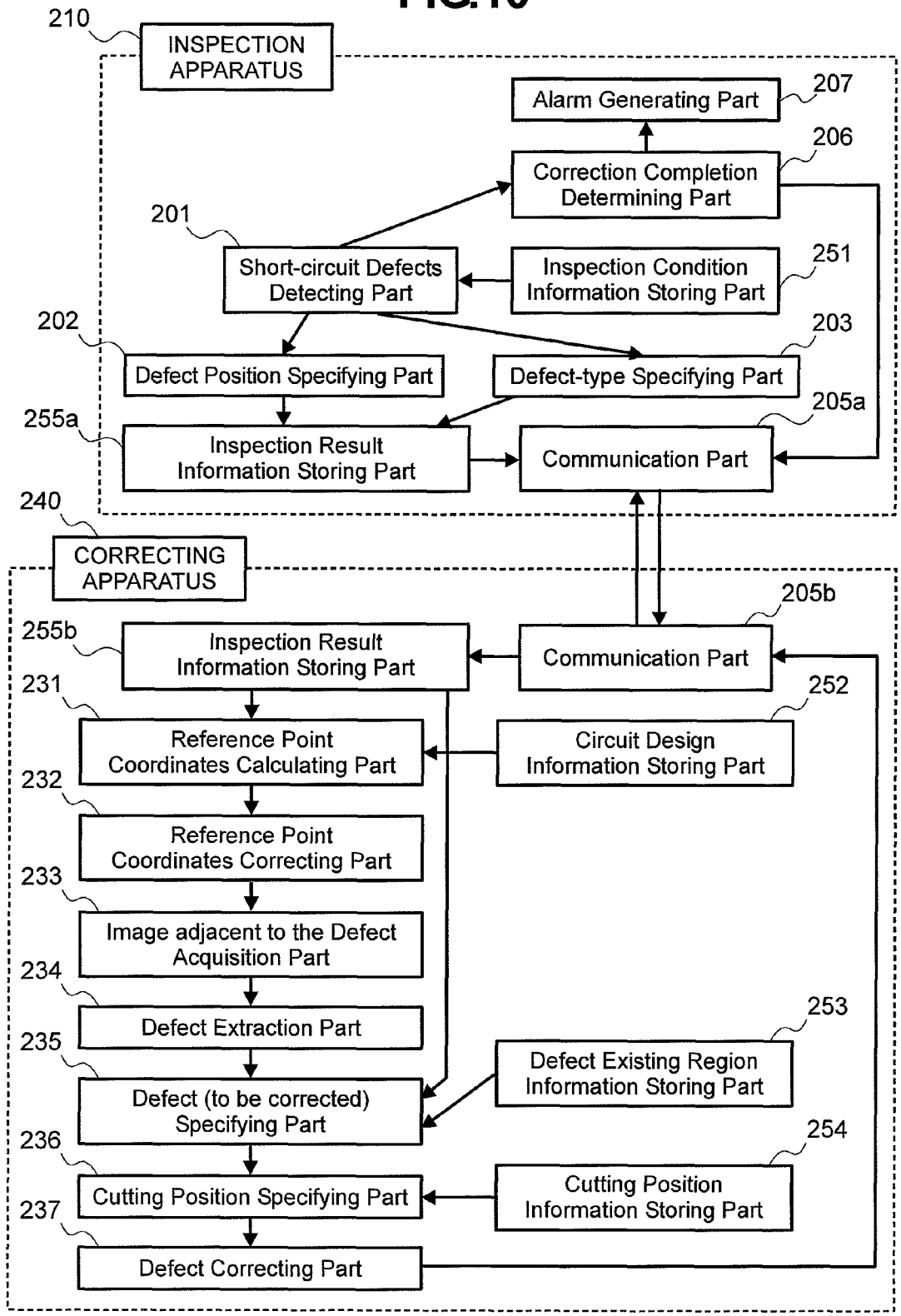
FIG. 10 illustrates a further system structure according to the second embodiment of the invention.
Figure 11:
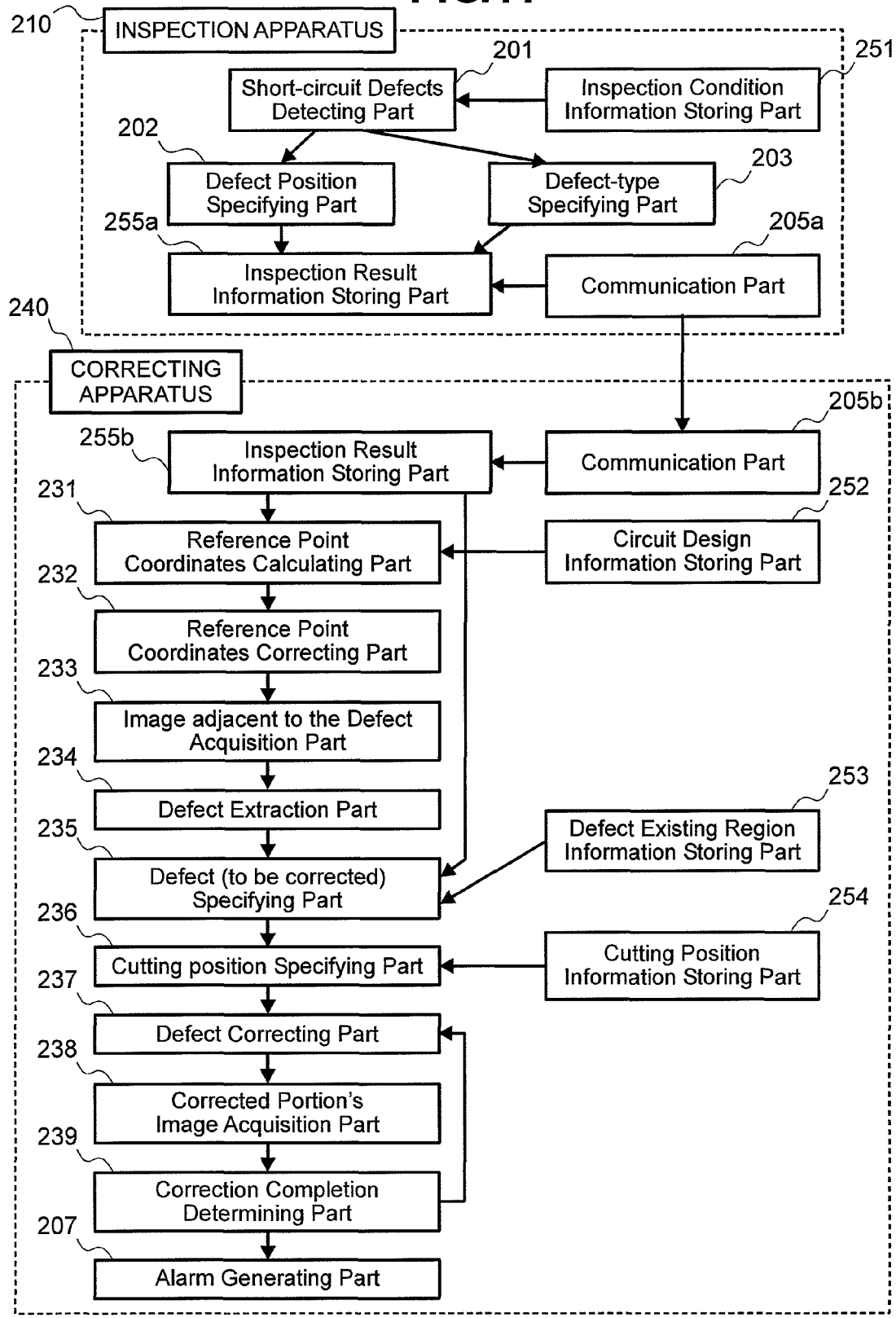
FIG. 11 illustrates a still further system structure according to the second embodiment of the invention.

While one device including the inspection unit, the correction unit and the memory unit is shown in FIG. 7, an inspection device 210 and the correction device 240 may be separate devices as shown in FIGS. 10 and 11. The inspection device 210 shown in FIG. 10 includes the short-circuit defect detecting part 201, the defect position specifying part 202, the defect type specifying part 203, the inspection condition storing part 251, an inspection result storing part 255a, a communication part 205a, the correction finish judging part 206, and the warning generating part 207. The correction device 240 includes the reference point coordinates calculating part 231, the reference point coordinates correcting part 232, the image acquisition part 233, the defect extracting part 234, the correction target defect specifying part 235, the cutting position specifying part 236, the defect correcting part 237, the circuit design storing part 252, the defect existing area storing part 253, the cutting position storing part 254, an inspection result storing part 255b, and a communication part 205b. The communication parts 205a and 205b are units through which inspection results are transmitted between the inspection device 210 and the correction device 240. As illustrated in FIG. 11, the correction target portion image acquiring part 238, the correction finish judging part 239, and the warning generating part 207 may be contained in the correction device 240.

Figure 12:
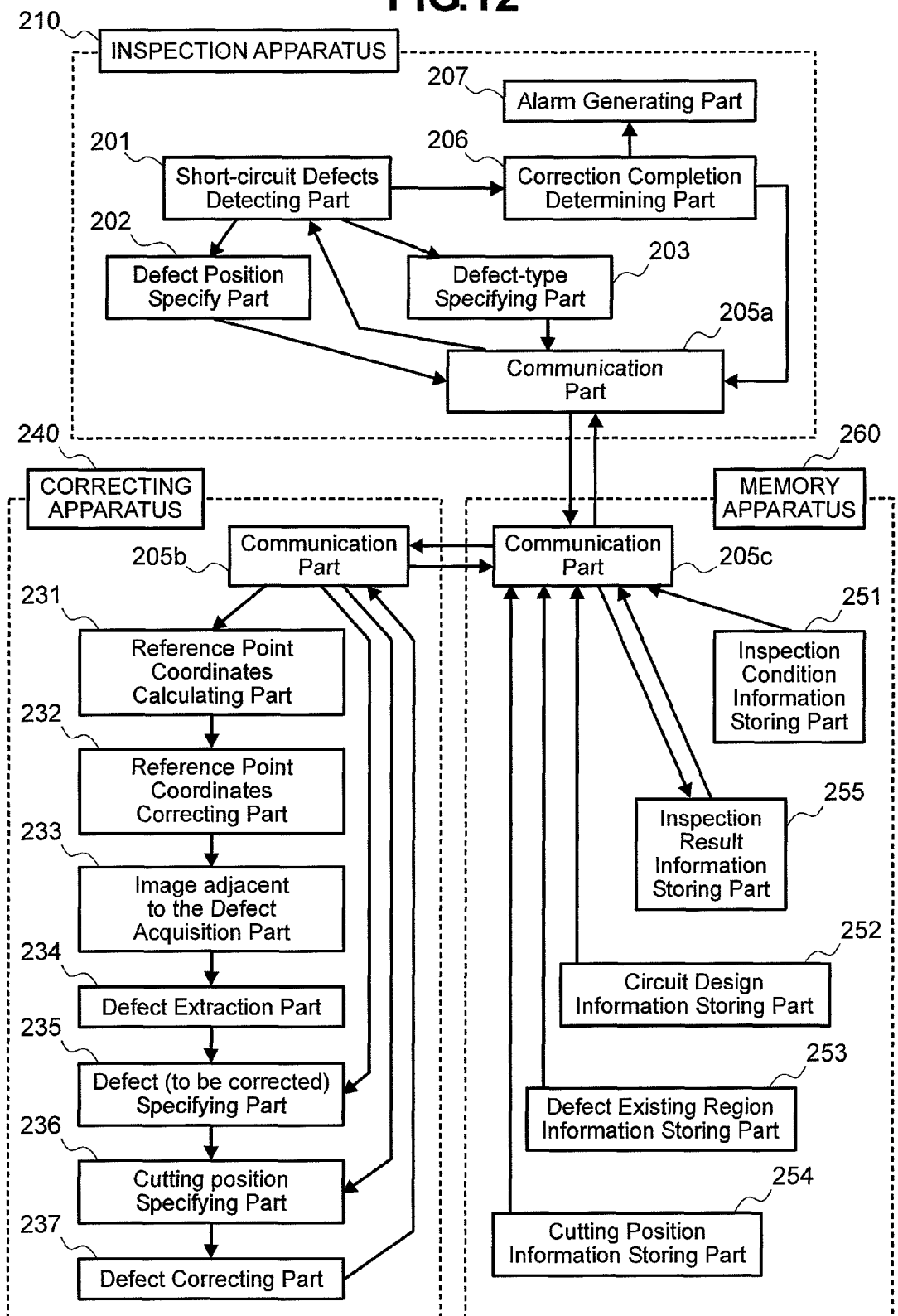
FIG. 12 illustrates a still further system structure according to the second embodiment of the invention.
Figure 13:
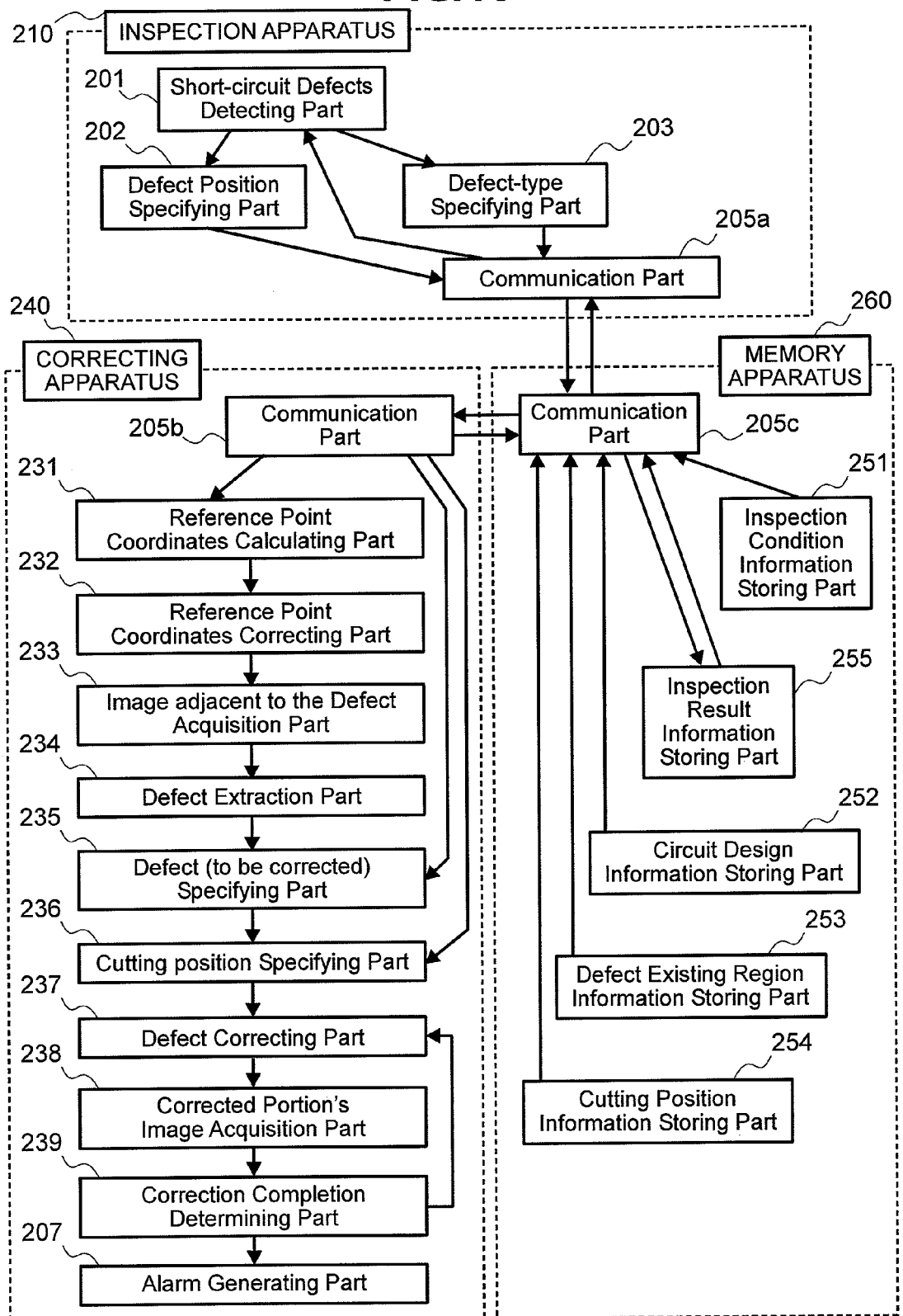
FIG. 13 illustrates a still further system structure according to the second embodiment of the invention.

Alternatively, as illustrated in FIGS. 12 and 13, the inspection device 210, the correction device 240, and a memory device 260 may be separately provided. The inspection device shown in FIG. 12 includes the short-circuit defect detecting part 201, the defect position specifying part 202, the defect type specifying part 203, the communication part 205a, the correction finish judging part 206, and the warning generating part 207. The correction device 240 includes the reference point coordinates calculating part 231, the reference point coordinates correcting part 232, the image acquisition part 233, the defect extracting part 234, the correction target defect specifying part 235, the cutting position specifying part 236, the defect correcting part 237, and the communication part 205b. The memory device 260 includes a communication part 205c, the inspection condition storing part 251, the inspection result storing part 255, the circuit design storing part 252, the defect existing area storing part 253, and the cutting position storing part 254. The inspection information required by the inspection device 210, the correction information required by the correction device 240, and the inspection results are stored in the memory unit 260, and are obtained via the communication part 205. Alternatively, as shown in FIG. 13, the correction portion image acquiring part 238, the correction finish judging part 239, and the warning generating part 207 may be contained in the correction device 240.

According to the structures shown in FIGS. 10, 11, 12 and 13, the inspection device may be a general array inspection device which uses electrostatic capacity sensor or electronic beam.

According to this embodiment, it is possible to correct only the correction target defect without applying laser beam to the foreign material included in the detected foreign materials and not requiring laser beam application. In this case, no defect is caused by erroneous laser beam application, and thus reduction of manufacturing cost is achieved. Furthermore, the necessity for operation to be performed by the operator is eliminated in the structure which can automatically judge whether laser beam application is necessary or not, which contributes to labor-saving.

Third Embodiment

Figure 16:
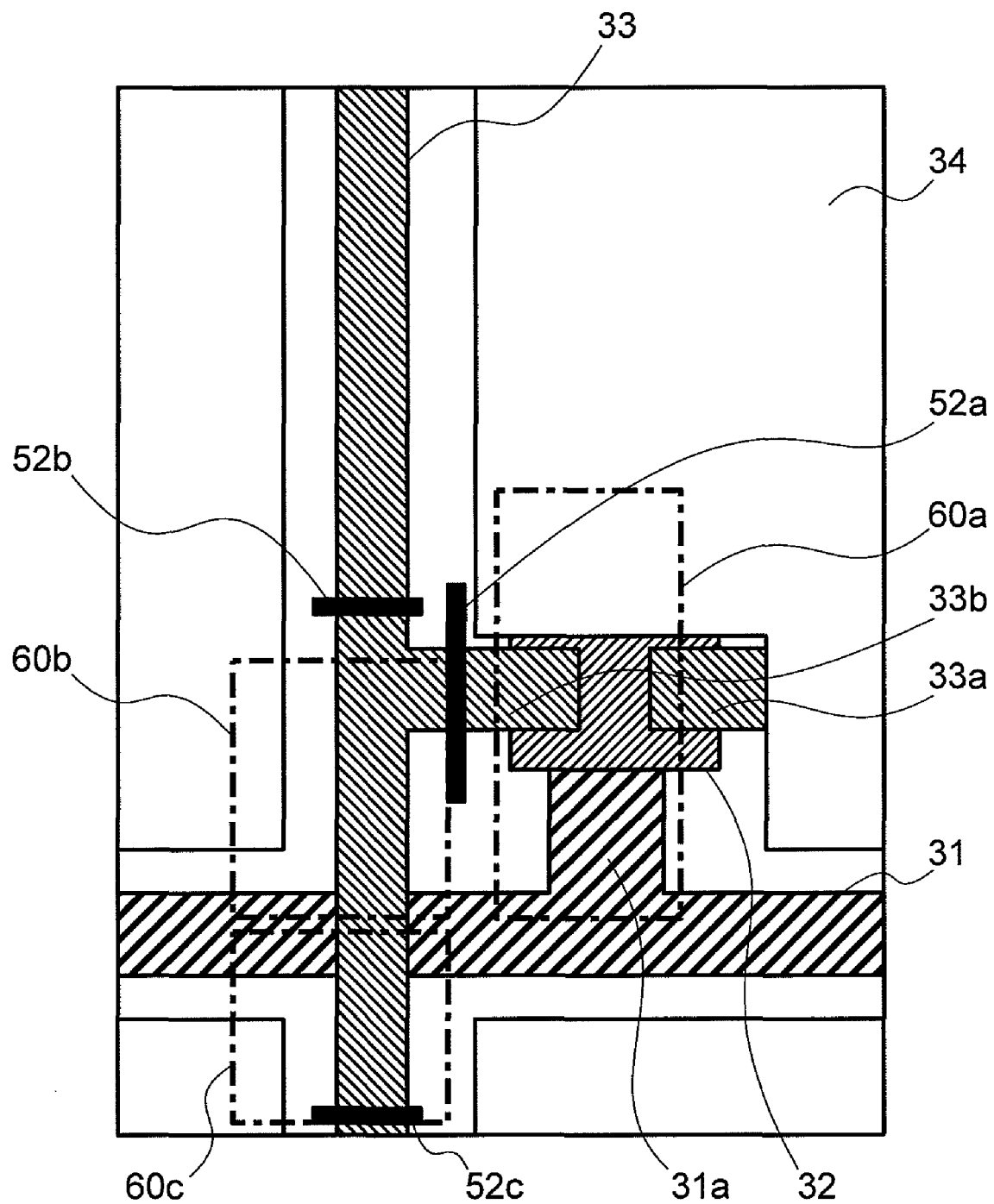
FIG. 16 illustrates a defect existing area according to a third embodiment of the invention.

A further embodiment of the invention is now described with reference to FIGS. 16 and 17. FIG. 16 illustrates a defect existing area according to a third embodiment of the invention. In this example, a plurality of defect existing areas 60a, 60b, 60c and 60d are defined. FIG. 17 shows a table for associating cutting positions with the defect existing areas. In FIG. 17, the table associates the cutting positions with defect types with one-to-one correspondence.

In case of the defect existing area 60 containing the plural defect existing parts as illustrated in FIG. 16, there is a possibility that a defect expands in the plural parts. In the condition where the cutting position 52 is stored in association with the defect existing area 60, the defect existing area 60a having the highest priority is selected by referring to the priorities given to the respective parts of the defect existing area 60. As a result, the cutting position 52a is determined. It is possible to define a plurality of positions as the cutting position 52 for one defect existing area 60. While the defect existing area 60 has a rectangular shape in this embodiment, the defect existing area 60 is not required to be rectangular. It is preferable that the defect existing area 60 is specified as polygon-shaped. A plurality of parts of the defect existing area 60 may have the same priority. In this case, the cutting positions 52 determined in the parts of the defect existing area 60 and having the same priority are all cut off.

Fourth Embodiment

Figure 18:
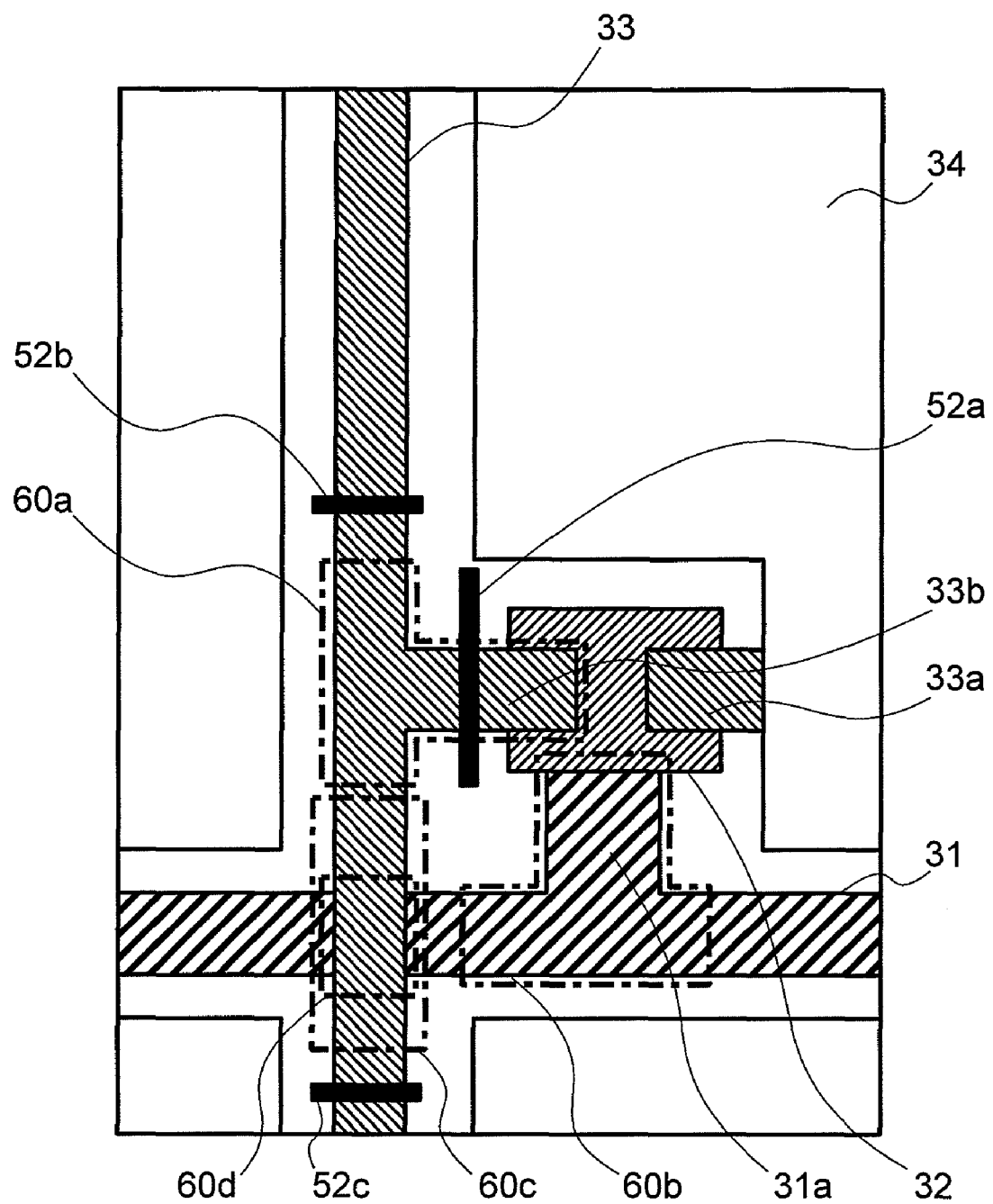
FIG. 18 illustrates a defect existing area according to a fourth embodiment of the invention.
Figures 19, 20:
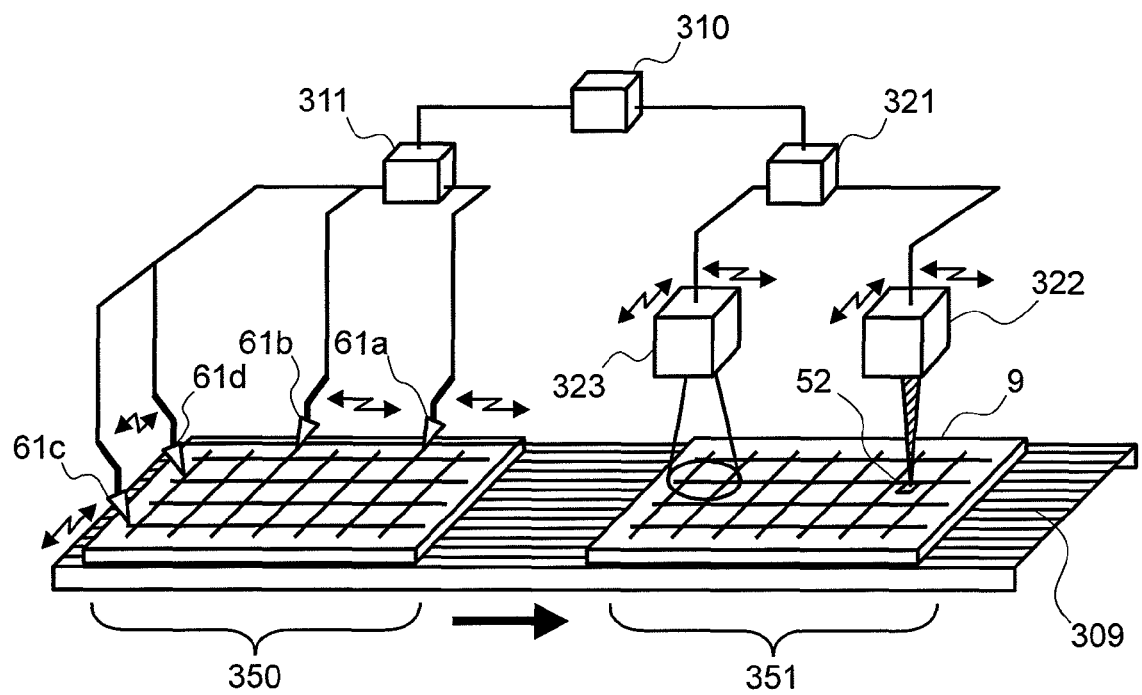
FIG. 19 shows another table associating cutting positions with defect existing areas.
FIG. 20 illustrates a system structure according to a fifth embodiment of the invention.

A still further embodiment of the invention is now described with reference to FIGS. 18 and 19. FIG. 18 illustrates a defect existing area according to a fourth embodiment of the invention. FIG. 19 shows a table for associating cutting positions with the defect existing area. It is known that short-circuit is caused when a defect expands in two electrodes. Thus, as viewed in a defect image, a defect expands in two electrodes or exists at the cross section of two electrodes. In this embodiment, the defect existing areas 60a and 60b are defined for each of two electrodes, and judges that short-circuit has been caused when a defect expands in the two defect existing areas.

For example, the defect existing area 60b is defined on the gate wiring 31 and the gate electrode 31a, and the defect existing area 60a is defined on the data wiring 33 and the drain electrode 33b. In this case, it is judged that short-circuit has been caused between the gate wiring 31 and the data wiring 33 when a defect exists on both the defect existing areas 60a and 60b. The short-circuit judgment rule is determined based on a table shown in FIG. 19, and stored beforehand. By using the short-circuit judgment rule, a defect expanding between the defect existing areas 60a and 60c defined on the same data wiring 33 is not erroneously judged as short-circuit. For judgment of short-circuit caused at the cross section of the gate wiring 31 and the data wiring 33, only the defect existing area 60d is defined as shown in No. 3 of the table in FIG. 19. Similarly to the case of the third embodiment, priorities are established in the short-circuit judgment rule, and the rule having high priority is selected.

Fifth Embodiment

A still further embodiment of the invention is now described with reference to FIGS. 20 through 22. FIG. 20 illustrates a system structure in a fifth embodiment of the invention. As illustrated in FIG. 20, an electronic circuit board 9 on which repeated patterns are formed is carried to a correction device, and then the electronic circuit board 9 is positioned at a predetermined inspection position 305. Two of probes 61a, 61b, 61c and 61d are attached to the pads 36 of wires to be inspected, and electric resistance value is measured by using a resistance measuring device 62 (not shown) provided on an inspection controller 311. In this case, the measurement conditions such as short-circuit judgment threshold values to be used are stored in an integrated controller 310 or the inspection unit controller 311. When the measured electric resistance value is smaller than the threshold value, it is judged that short-circuit has been caused. Then, the defect type and the number of the electrode causing the defect are stored in the integrated controller 310.

After inspection of short-circuit between electrodes in predetermined combinations, the electronic circuit board 9 is shifted to a correction position 351 by using a carrying device 309. A correction unit controller 322 obtains short-circuit defect data from the integrated controller 310, shifts an image pickup element 323 to a reference point position in the vicinity of the defect to acquire an image, and then transmits image data to the correction unit controller 321. The correction controller 321 detects the reference point position, and sets the defect existing area 60 to specify the defect to be corrected and calculate the cutting position 52.

A correction tool 322 constituted by laser beam, micromanipulator, or micro-plasma executes cutting after positioning at the cutting position 52. The image pickup element 323 is again positioned at the cutting position to judge whether the cutting has been completed based on the image obtained from the image pickup element 323. When it is judged that the cutting has been completed, the electronic circuit board 9 is shifted out of the correction device. When it is judged that the cutting is not finished, the correction tool 323 again executes cutting. The cutting finish judgment and re-correction are repeated until judgment of correction finish is made. When cutting is not completed even after repetition of these steps predetermined times, the correction operation is suspended with emission of warning.

Figure 21:
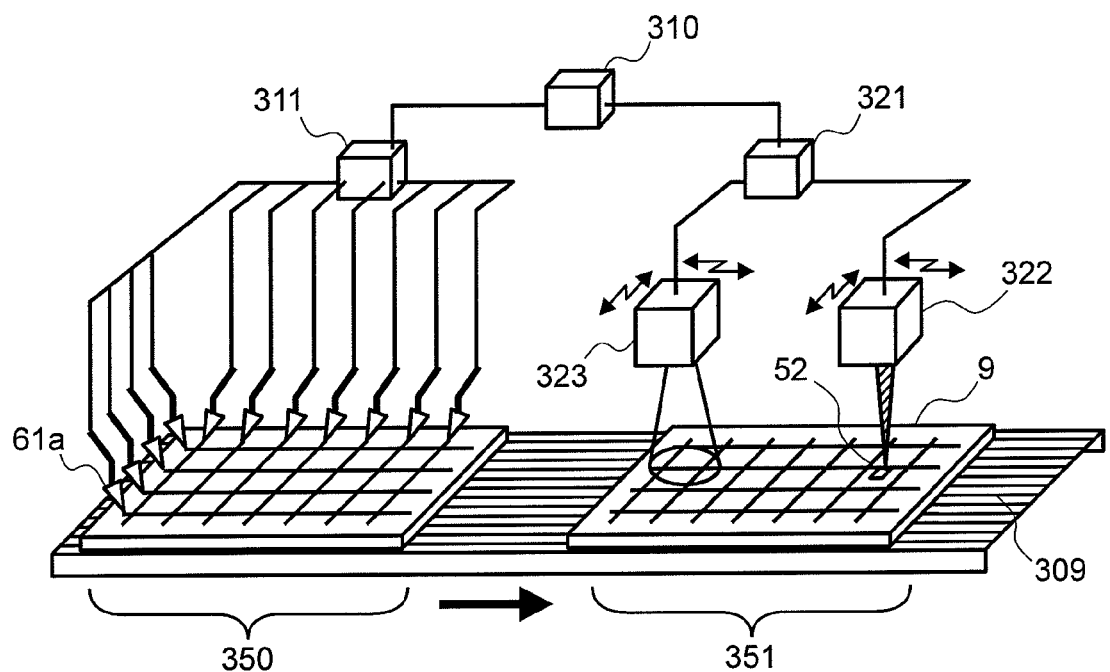
FIG. 21 illustrates another system structure according to the fifth embodiment of the invention.

As illustrated in FIG. 21, the inspection unit 350 may attach the probes 61 to the pads 62 of all the electrodes. In this case, the electrodes to be measured are sequentially switched by the inspection unit controller 311 to measure electric resistance value of these electrodes. Alternatively, the electronic circuit board may be positioned for each of the inspection unit and correction unit so that inspection and correction can be performed simultaneously.

Figure 22:
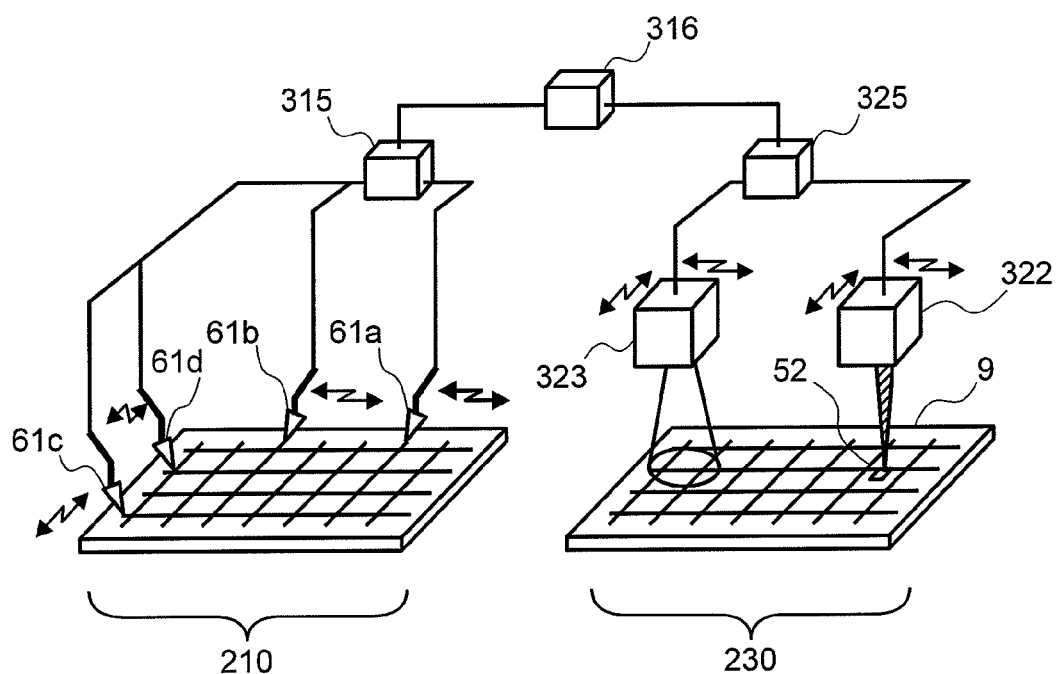
FIG. 22 illustrates a further system structure according to the fifth embodiment of the invention.

FIG. 22 shows a system separately including the inspection device 210 and the correction device 240. The results obtained by the detection device 210 are transmitted to a memory device 316 via an inspection device controller 315. While the inspection device which measures electric resistance value by using the probes 61 for contact has been shown, a general array inspection device using electrostatic capacity sensor or electronic beam may be used. Alternatively, the inspection conditions necessary for inspection may be stored in the memory device 316 to be read as necessary. The correction device 230 reads the inspection results from the memory device 316 under the control of the correction device controller 325, and performs correction process. The correction conditions necessary for correction may be similarly stored in the memory device 316 to be read as necessary. This structure is appropriately used when the time required for inspection is different from the time required for correction.

The technology of the invention is used for correcting an electronic circuit board on which repeated patterns are formed, and also applicable to manufacture of liquid crystal display panel, plasma display panel, organic EL (electro luminescence) display panel, and FED (field emission display) panel, and other similar electronic devices.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

What is claimed is:

1. An apparatus for manufacturing an electronic circuit board on which are provided a plurality of first wirings placed side by side, a plurality of second wirings placed in a direction across from the plurality of the first wirings, and electric circuit patterns formed as a combination of the plurality of the first wirings and the plurality of the second wirings, comprising:

a defect detecting part detects a defect by electrically inspecting each of the plurality of the first wirings and the plurality of the second wirings and specifies an electric circuit pattern which has the defect;

a defect-type specifying part specifies a type of the defect in the electric circuit pattern which has been detected through the electric inspection;

a defect position specifying part acquires an image of the specifying electric circuit pattern that contains the defect and detects a position of the defect in the acquired image;

a modification specifying part selects a defect existing region information stored in a storage device according to the type of the defect and determines a method of correcting the defect by comparing the position of the defect to the defect existing region information; and a defect correcting part corrects a defect existing area, wherein each of the plurality of the first wirings and each of the plurality of the second wirings forms data wirings and gate wirings;

wherein specific position numbers of the gate wirings and the data wirings determines a location of a short-circuit; and wherein the defect type is specified according to which data wirings and gate wirings causes the short circuit.

2. The apparatus for manufacturing an electronic circuit board according to the claim 1, wherein the defect is caused by shortage of insulating characteristics of an insulating film.

3. The apparatus for manufacturing an electronic circuit board according to the claim 1, wherein the defect existing region information combines information related to a region in the electric circuit pattern, a defect that occurs in the region, and a method of modification of the defect.

4. The apparatus for manufacturing an electronic circuit board according to the claim 1, wherein the modification specifying part selects a cutting position stored in the storage device in advance based on the defect existing area and the defect type.

5. The apparatus for manufacturing an electronic circuit board according to the claim 1, further comprising:
 a modification completion determining part determines whether or not to complete the modification by acquiring an image of a modified region of an electric circuit.

* * * * *